US008640080B1

(12) United States Patent
Salowe et al.

(10) Patent No.: US 8,640,080 B1
(45) Date of Patent: Jan. 28, 2014

(54) METHOD AND SYSTEM FOR VISUALIZING PIN ACCESS LOCATIONS

(75) Inventors: Jeffrey S. Salowe, Los Gatos, CA (US); Satish Raj, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/486,437

(22) Filed: Jun. 1, 2012

(51) Int. Cl.
*G06F 17/50* (2006.01)

(52) U.S. Cl.
USPC .......................................... 716/139; 716/119

(58) Field of Classification Search
USPC ......................................... 716/118–123, 139
See application file for complete search history.

(56) References Cited

U.S. PATENT DOCUMENTS

| 6,075,934 | A  | * | 6/2000  | Chiluvuri et al. | 716/122 |
| 2003/0121019 | A1 | * | 6/2003  | Brown et al.     | 716/12  |
| 2005/0273747 | A1 | * | 12/2005 | Malhotra et al.  | 716/13  |

* cited by examiner

*Primary Examiner* — Binh Tat
(74) *Attorney, Agent, or Firm* — Vista IP Law Group, LLP

(57) ABSTRACT

Disclosed is a method and system for visualizing pin access locations on an integrated circuit design. Visual feedback is provided to a user that is attempting to connect a wire or a via to a pin structure polygon on the integrated circuit design. The visual feedback comprises any visual cue that provides an indication of a legal location to access the pin.

27 Claims, 22 Drawing Sheets

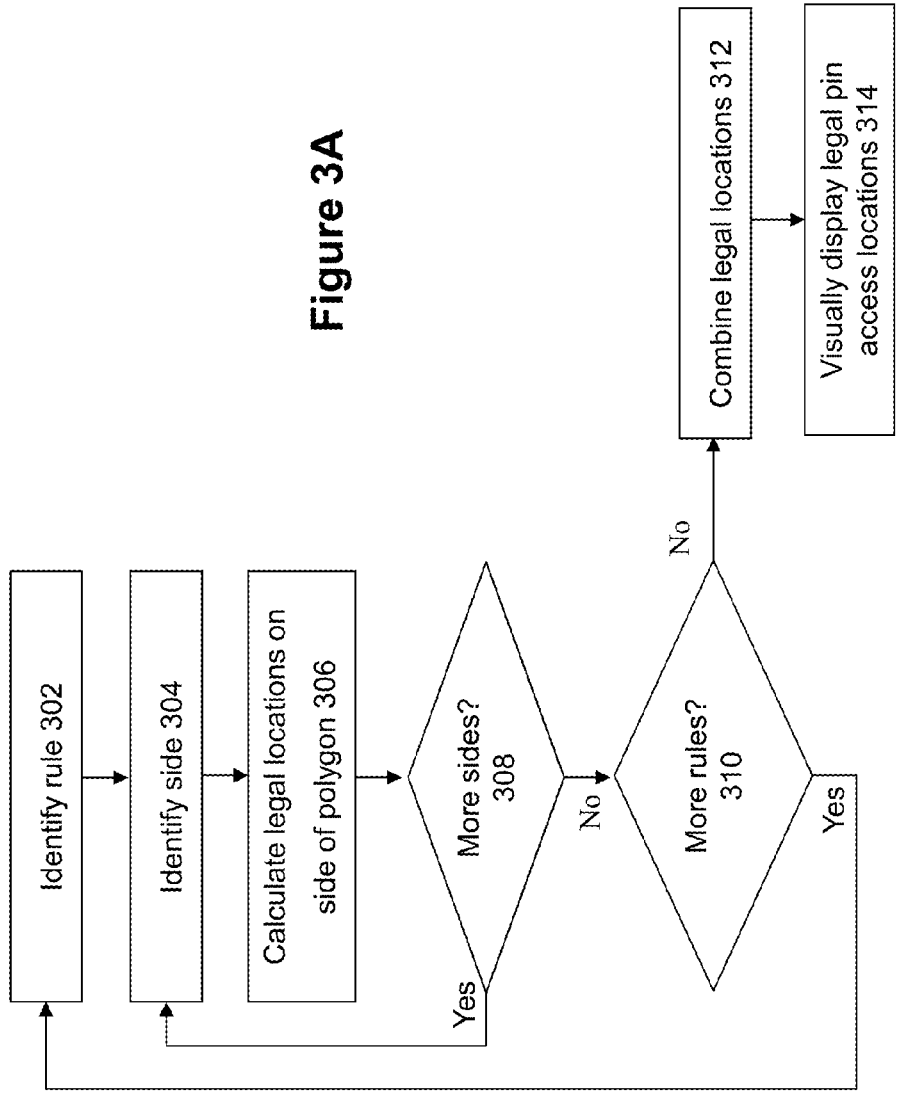

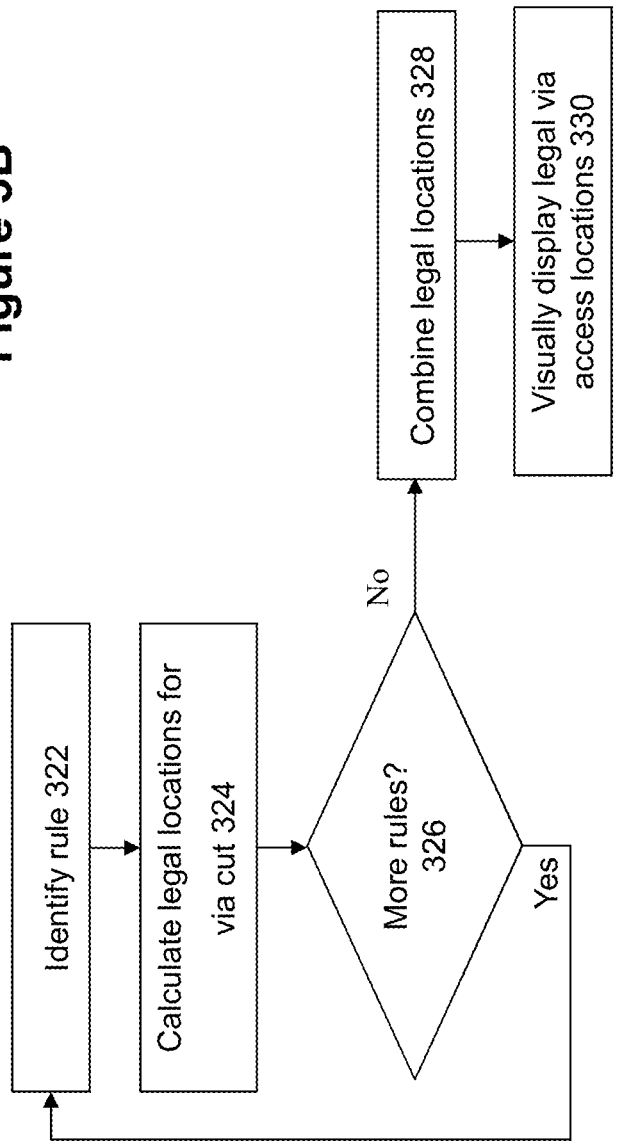

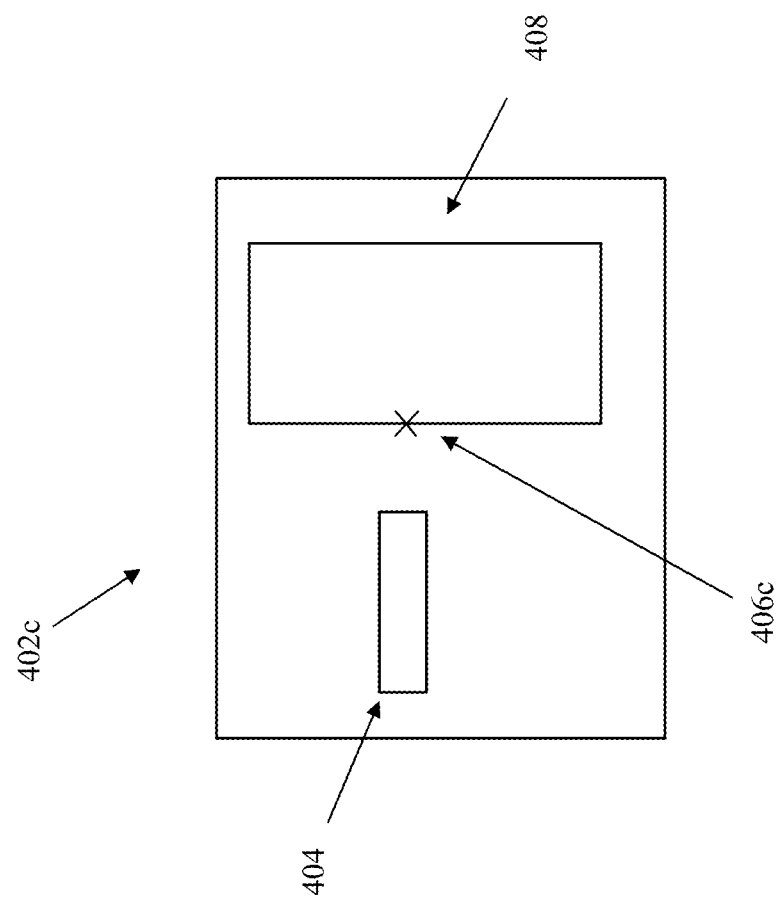

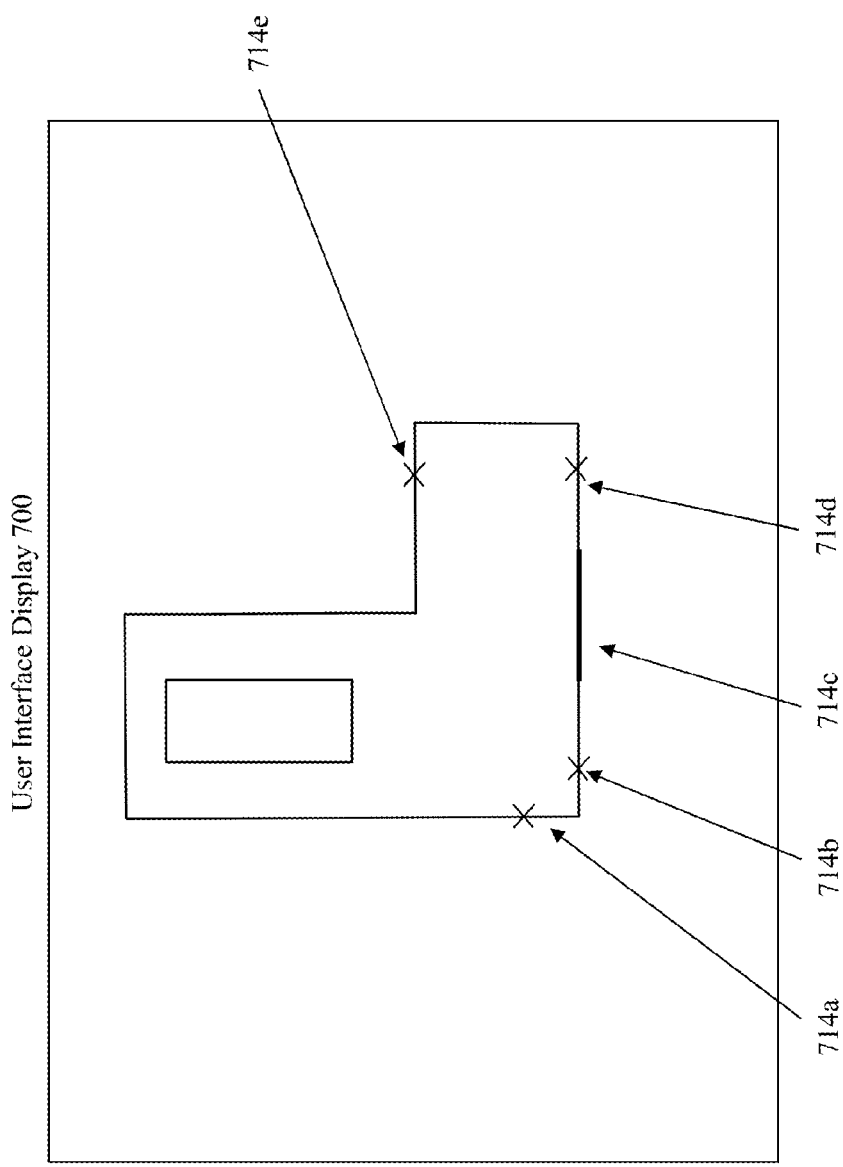

METHOD AND SYSTEM FOR VISUALIZING PIN ACCESS LOCATIONS

FIELD

The invention relates to the implementation of electronic designs, such as the design of Integrated Circuits (ICs).

BACKGROUND

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. Component devices and interconnections of the integrated circuit are constructed layer by layer. A layer is deposited on the wafer and then it is patterned using a photolithography process and an etch process.

One or more photomasks are created from the layout file for the photolithography of each layer. Photomasks are used to transfer the layout pattern onto the physical layer on the wafer. A photomask, or mask, provides an image of the desired physical geometries of the respective integrated circuit layer. Passing light through the mask projects the layout pattern for the layer onto the wafer. An imaging lens system projects and focuses the layout onto the substrate. The projected light pattern interacts with a photosensitive resist coating on the wafer and, resist portions that are exposed to light are rendered either soluble or insoluble in a developer solution, depending on the type of the photoresist. Accordingly, the mask pattern is transferred into the photo-resist by optical projection and chemical reactions. The photo-resist pattern is subsequently transferred to an underlying layer by an etch process. Most commonly, plasma containing chemically-selective reactive ions is used to etch high-aspect ratio trenches and holes with close to vertical sidewalls.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is increasingly limited by the inherent limitations of conventional semiconductor manufacturing processes when manufacturing extremely small feature sizes.

For example, consider the problem of routing a wire or a via to a pin in advanced technology nodes, such as processes at feature sizes of 22 nm and below. It has become very difficult for an engineer or designer to identify the legal locations within a design to access a pin. In part, this is due to the number, extent, and complexity of the design rules that must be considered and then understood in order to identify the exact locations at which a wire or via can be routed on a layout. This becomes even more of a problem in submicron designs where there are very few legal locations at which it is permitted to access a pin. This is particularly problematic for engineers that need to utilize interactive design tools when designing a circuit.

Therefore, there is a need for an improved approach to facilitate the design of electronic circuits, particularly with respect to the design of layout and routes to access pins on an integrated circuit design.

SUMMARY

Embodiments of the invention provide a method and system for visualizing pin access locations on an integrated circuit design. Visual feedback is provided to a user that is attempting to connect a wire or a via to a pin structure polygon on the integrated circuit design. In some embodiments, the visual feedback comprises any visual cue that provides an indication of a legal location to access the pin. Examples of such visual cues include coloring, highlighting, crosshairs, and the like. The visualized locations on the design are selected such that they correspond to locations that are predicted to avoid a design rule violation. For example, during interactive editing of an electronic design, the user can be visually guided to these access spots.

Other and additional objects, features, and advantages of the invention are described in the detailed description, figures, and claims.

BRIEF DESCRIPTION OF FIGURES

FIGS. 3A-B show flowcharts of approaches to identify legal pin access locations according to some embodiments of the invention.

FIGS. 4A-D illustrate example user interface 402a that provide visual cues to distinguish legal pin access locations from non-legal locations according to some embodiments of the invention.

FIG. 7 shows a user interface display 700 that provides visual cues to indicate legal pin access locations to a user according to some embodiments of the invention.

DETAILED DESCRIPTION

In advanced technology nodes, process rules limit the ways that pins or other polygons can be accessed. Users will need additional assistance to avoid creating DRC errors. Embodiments of the invention provide a method and system for visualizing pin access locations on an integrated circuit design.

Visual feedback is provided to a user that is attempting to connect a wire or a via to a pin structure polygon on the integrated circuit design. In some embodiments, the visual feedback comprises any visual cue that provides an indication of a legal location to access the pin. Examples of such visual cues include coloring, highlighting, crosshairs, and the like. The visualized locations on the design are selected such that they correspond to locations that are predicted to avoid a design rule violation. For example, during interactive editing of an electronic design, the user can be visually guided to these access spots.

Figure 1:
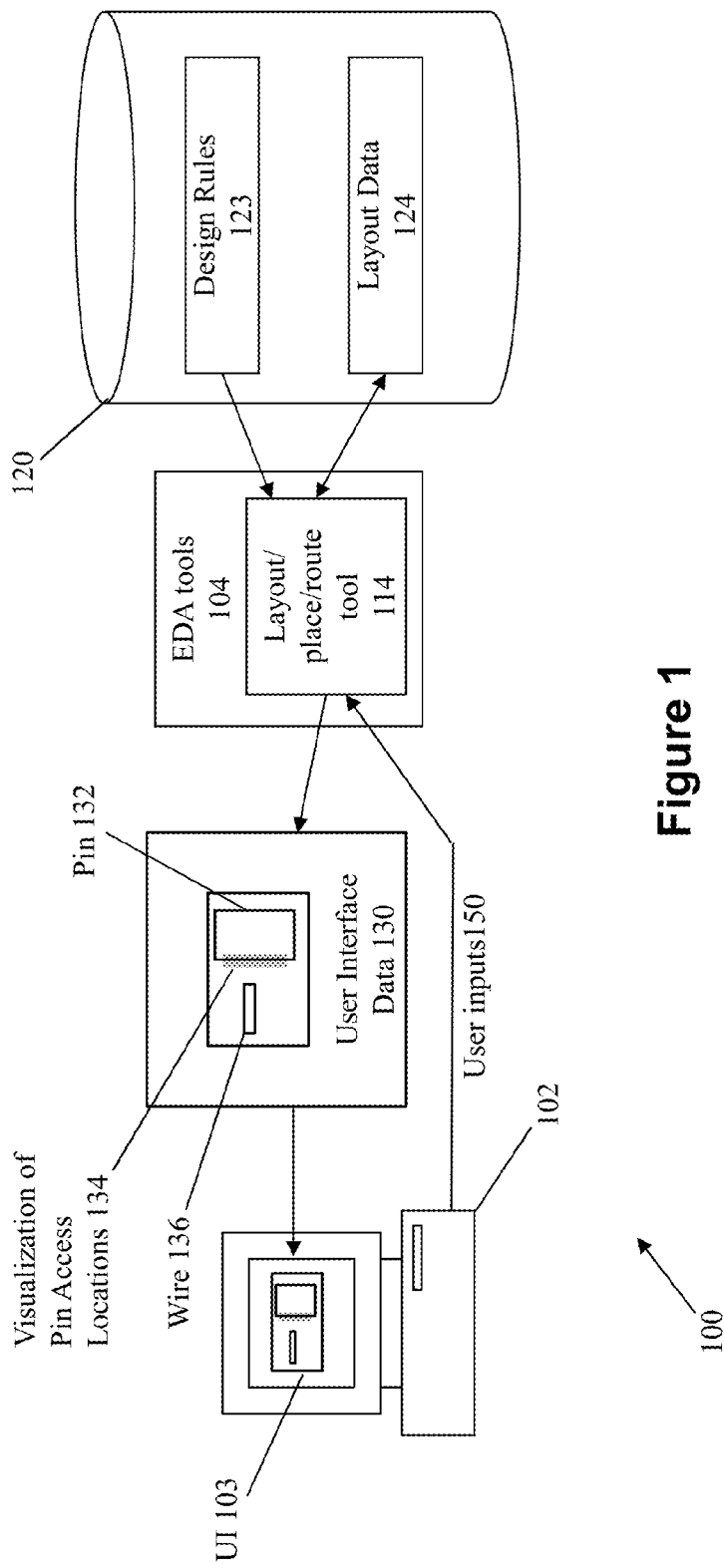
FIG. 1 depicts an architecture of a system for visually presenting pin access locations according to some embodiments of the invention.

FIG. 1 illustrates an example system 100 which may be employed in some embodiments of the invention to implement visualization of pin access locations. System 100 includes one or more users at one or more user stations 102 that operate the system 100 to design or edit electronic designs. Such users include, for example, design engineers or verification engineers. User station 102 comprises any type of computing station that may be used to operate, interface with, or implement EDA applications or devices. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface to generate user inputs 150.

The electronic designs may be stored in a computer readable storage device 120. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

One or more computer aided design (CAD) tools or electronic design automation (EDA) tools 104, such as a layout, place, and/or route tool 114, may be used by users at a user station 102 to create or edit the layout 124 of an electronic design. The tool 114 may create, edit, visualize, and/or verify layout 124 with consideration of design rules 123. According to the present embodiment, the computer readable storage device 120 may be utilized to hold the electronic design rules 123 and the layout data 124.

The tool 114 determines legal locations for allowing access by routing components to a pin within the layout 124. In part, this occurs by preprocessing the pin polygon to create a set of access points, with consideration of data such as information regarding a pin polygon, associated via cuts, rule information, and information about the prospective connect (wire width, min edge length, etc). These access points are subsets of the polygon perimeter boundary (for planar access) and subsets of the interior of the polygon (for via access). For planar access in some embodiments, an access point is one that the centerline of the wire (of the input width) is allowed to attach to perpendicular to the polygon edge. For via access, an access point is one that the center of the proposed via is allowed to attach to (land on).

During interactive editing, especially when nearby the pin, the access points will appear and assist the wire editor to access the polygon legally. User interface data 130 is generated to be displayed within a user interface 103 on the user station 102. The user interface data 130 will display the pin polygon 132 and will also include a visual depiction 134 of legal access locations on pin 132 for a routing structure, such as wire 136.

Figure 2:
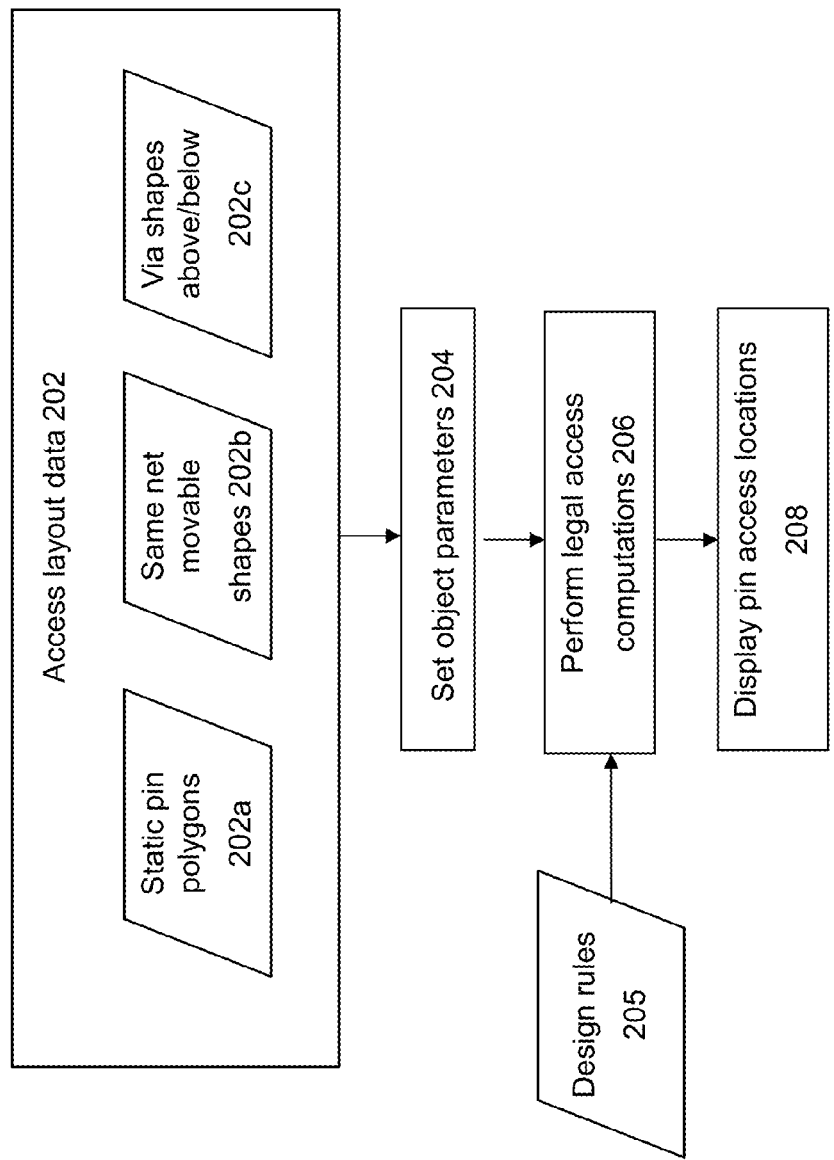
FIG. 2 shows a high level flow of an approach for visually presenting pin access locations according to some embodiments of the invention.

FIG. 2 shows a high level flow of a process for implementing the inventive approach according to some embodiments of the invention. At 202, the layout data is accessed for the electronic design. In some embodiments, the layout data to be accessed includes pin polygon data 202a for the pin of interest. This data 202a generally comprises the shape information for the static metal shapes corresponding to the pin. In addition, the data to be accessed includes data 202b about "movable" shapes on the same net. Data 202b corresponds to objects that are connected to the pin on the same plane. Examples of such objects include metal wire shapes and via shapes that are connected to the pin. The layout data to be accessed also includes data 202c regarding via cut shapes above and below the pin polygon.

At 204, parameters are identified for the object to be routed to the pin, e.g., by gathering information about the wire or via that is to be connected to the pin. Such parameters include, for example, information regarding wire width, wire direction, wire orientation, via type, and/or via cut size.

At 206, legal access locations are determined for allowing access by the routing components to the pin polygon. As described in more detail below, this occurs by processing the pin polygon to identify a set of access points that would be legal according to design rules 205, with consideration of the object parameters identified in step 204. These access points are subsets of the polygon perimeter boundary (for planar access) and subsets of the interior of the polygon (for via access). The shapes of movable objects may be used as part of the pin polygon shape to identify legal pin access locations.

In some embodiments, for planar access, an access point is where the centerline of the wire (of the input width) is allowed to attach in a perpendicular manner to the polygon edge. For via access, an access point is at the center of where the proposed via is allowed to attach to the pin.

At 208, the identified access locations on the pin polygon are visually displayed to the user. As described in more detail below, any suitable visual cue may be utilized to distinguish the legal access locations from other (non-legal) locations. The visual cues are displayed in a user interface that is accessible and visible to the user. In some embodiments, the visual presentation of the access points is made in an interactive layout editing tool. Therefore, one or more input mechanism are provided to allow the user to generate input controls that control the activity of the interactive layout editing tool, e.g., to interactively create or edit the location of a wire or via object on the layout to one of the displayed legal pin access locations in conjunction or in response to the displayed of the legal locations on the user interface.

FIG. 3A shows a flowchart of an approach to identify legal planar pin access locations. The approach generally processes each side of the pin polygon with regard to each applicable design rule. Therefore, the approach performs a processing loop for each rule and for each side of the polygon. At 302, a rule is selected and at 304 a side of the pin polygon is selected for processing.

At 306, a determination is made of the legal access location on each side of the pin polygon. The step generally calculates the specific locations on the pin polygon side of interest for which placement of the wire will not cause a design rule violation. Heuristics may be employed to make this determination.

A determination is made at 308 whether there are more sides to be processed for the identified rule. If so, then the process returns back to 304 to select another side of the pin polygon. If not, then a determination is made at 310 whether there are more rules to be processed. If so, then the process returns back to 302 to select another rule for processing.

If, however, all of the sides for the pin polygon have been processed for the rules of interest, then the identified legal locations are combined at 312. A Boolean AND operation can be employed to combine the legal pin access locations. Thereafter, the legal pin access locations are visually displayed the user at step 314.

It is noted that this process may be implemented at step 306 to identify the illegal pin access locations along each side of the pin polygon (rather than the legal pin access locations). In this alternate approach, the step 312 of combining the identified locations along the sides of the pin polygon would be achieved by performing a Boolean OR operation of the identified location. The inversion of this result set would be used to create a list of the legal pin access location to be displayed at step 314.

FIG. 3B shows a flowchart of an approach to identify legal pin access locations for via connections to the pin. The approach generally processes the interior of the pin polygon with regard to each applicable design rule to identify locations within the pin shape that can be used to place a via without violation of the design rules. Therefore, the approach performs a processing loop for each rule for the interior of the pin polygon. At 322, a rule is selected for processing.

At 324, a determination is made of the legal access location(s) within the pin polygon for the via with respect to the selected rule. The step generally calculates the specific locations within the pin shape polygon for which placement of the via will not cause a design rule violation. Heuristics may be employed to make this determination.

A determination is made at 326 whether there are more rules to be processed. If so, then the process returns back to 322 to select another rule for processing. If, however, all of the applicable rules have been processed, then the identified legal pin access locations are combined at 328. A Boolean AND operation can be employed to combine the legal pin access locations. Thereafter, the legal pin access locations are visually displayed the user at step 330.

It is noted that this process may also be implemented to identify the illegal pin access locations at step 324 (rather than the legal pin access locations). As before, in this alternate approach, the step 328 of combining the identified locations along the sides of the pin polygon would be achieved by performing a Boolean OR operation of the identified location. The inversion of this result set would be used to create a list of the legal pin access location to be displayed at step 330.

Any suitable visualization technique may be utilized to visually distinguish the legal pin access locations for the pin polygon. The visual cues are displayed in a user interface that is accessible and visible to the user. Examples of such visual cues include coloring, highlighting, crosshairs, and the like. The visualized locations on the design are selected such that they correspond to locations that are predicted to avoid a design rule violation.

Figure 4A:
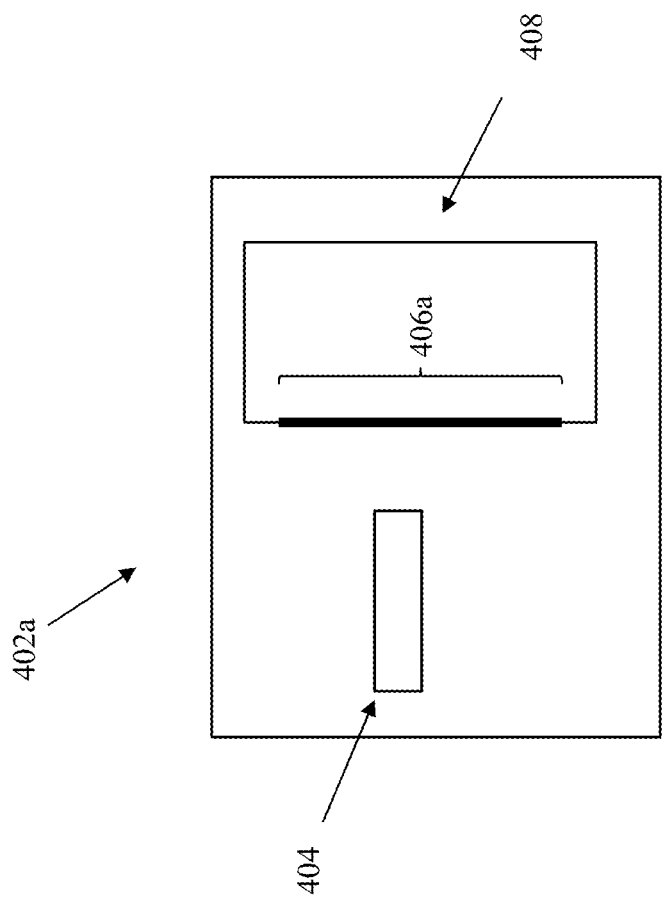

FIG. 4A illustrates a user interface 402a that uses different coloring to distinguish legal pin access locations from non-legal locations on the pin polygon. The example user interface 402a shows a pin polygon 408 along with a wire object 404 to be connected to the pin polygon 408. Using the process described above, it is assumed that pre-processing has already occurred to identify a set of legal pin access locations on the pin polygon 408. As shown in FIG. 4A, these legal pin access locations are visually displayed with a different line coloring 406a from the other portions of the pin polygon.

Figure 4B:
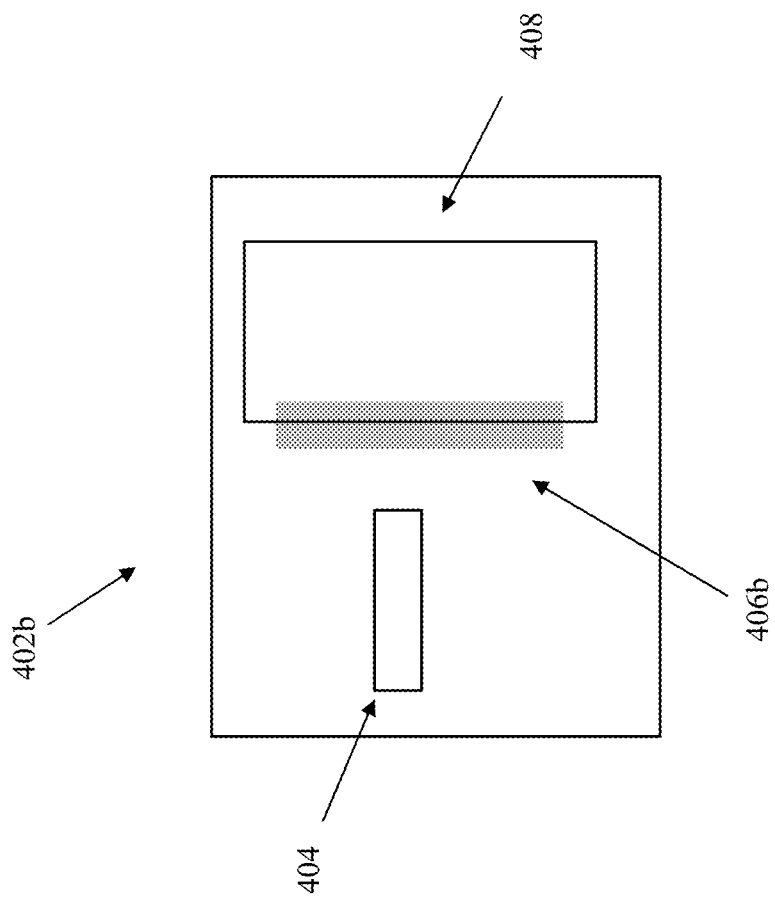

FIG. 4B illustrates another example user interface 402b that uses different approach to distinguish the legal pin access locations from non-legal locations on the pin polygon. As before, the example user interface 402b shows a pin polygon 408 and a wire object 404 to be connected to the pin polygon 408. In this alternate approach, the legal pin access locations are visually displayed with highlighting 406b to distinguish from the other portions of the pin polygon. The highlighting 406b may be implemented with any suitable coloring to provide enhanced visual presentation of the legal pin access locations for wire 404.

FIG. 4C illustrates an example user interface 402c that identifies specific points or locations on a side of the pin polygon 408 to place the wire 404. This approach displays an indicator at the specific points which are legal pin access points. For example, a crosshair indicator 406c may be visually displayed on the pin shape to identify the legal pin access point(s), e.g, the location at which the centerline of the wire may be legally placed to avoid violations of the design rules. The crosshair indicator 406c may be implemented with any suitable coloring to provide enhanced visual presentation of the indicator 406c.

Figure 4D:
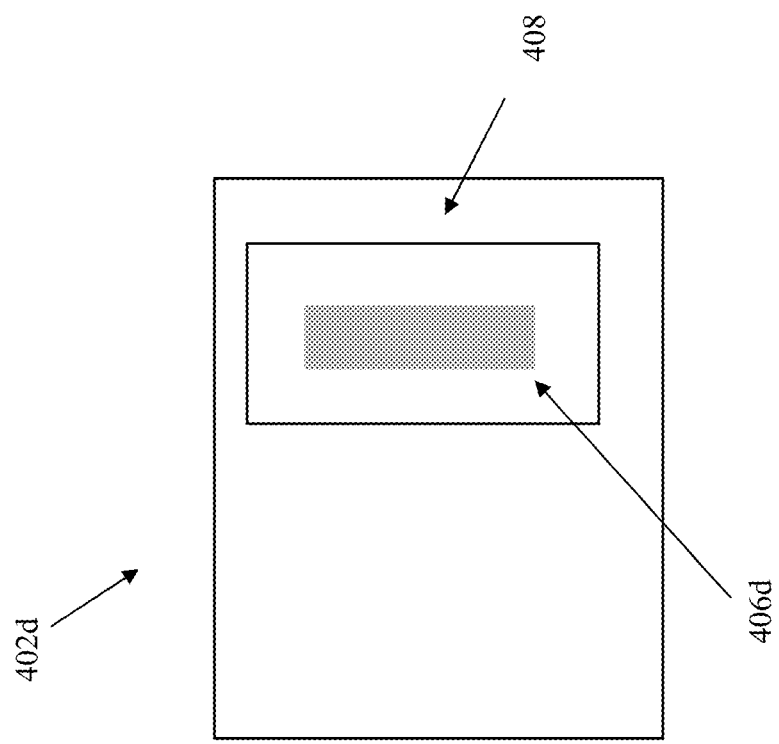

Similar visual cues may be provided within the interior of the pin polygon 408 to identify the legal pin access locations for via placement. FIG. 4D illustrates an example user interface 402d that identifies locations within the interior of the pin polygon 408 to place a via. Any of the previously described approaches may be employed to provide the visual indicators of the legal pin access locations. For example, a colored or highlighted portion 406d within the interior of the pin polygon 408 may be displayed to identify the legal locations within the interior of the pin shape where a via may be legally placed to avoid violations of the design rules.

Figure 5:
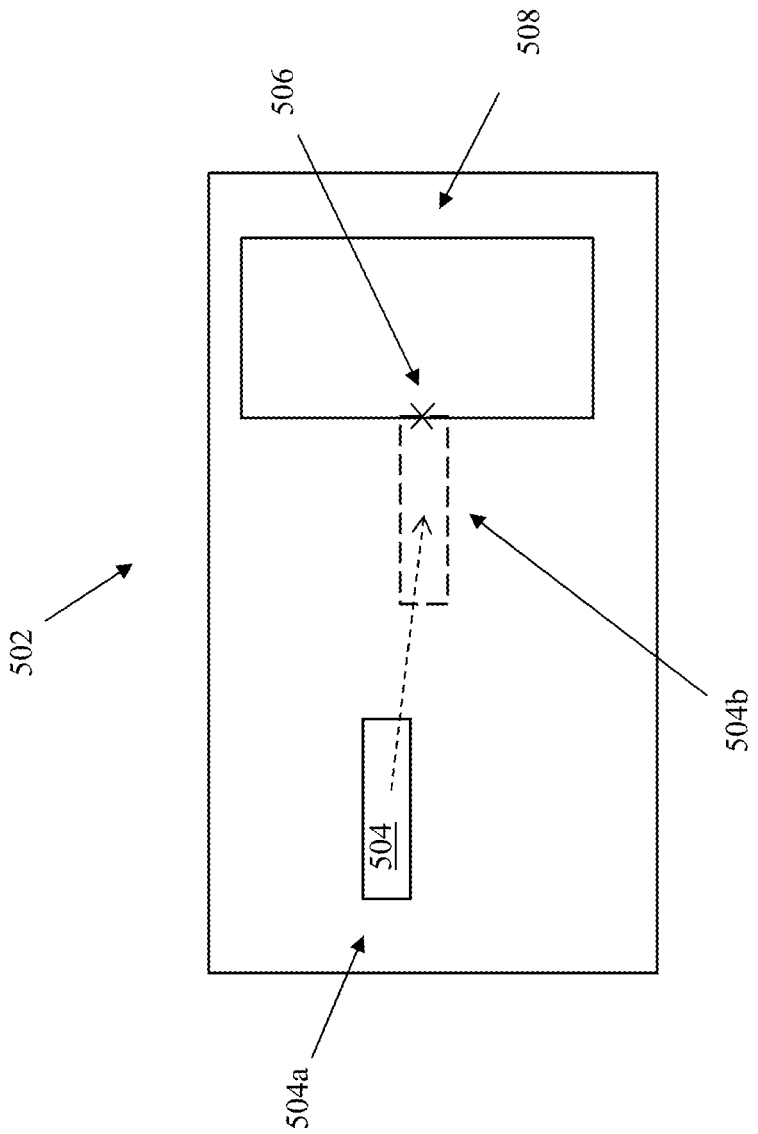
FIG. 5 illustrates snapping functionality according to some embodiments of the invention.

Embodiments of the invention may be configured to facilitate or assist placement of objects in legal pin access locations. For example, as shown in the example interface 502 of FIG. 5, "snapping" functionality may be implemented to automatically move the location of an object, such as wire object 504, into a legal location relative to a pin object 508.

Using the approach described above, one or more legal pin access locations for a pin object 508 can be identified and/or visually displayed within user interface 502. For example, a crosshair indicator 506 may be used to visually indicate the location of a legal pin access location on the pin object 508 relative to placement of wire object 504.

Assume that the wire object 504 is currently at position 504*a*. Based upon the location of the indicator 506, it is known that the wire object can be legally positioned at location 504*b*. Therefore, snapping can be employed to automatically "snap" the wire object from its current position 504*a* to its legal placement position 504*b*. A similar approach can be employed to snap vias to legal placement locations within the interior of the pin shape.

If there are multiple legal pin access locations, then any suitable snapping parameters may be implemented to determine the automated snap location. For example, the wire direction and orientation information can be used to identify the most suitable and/or closest legal pin access location for placement of the wire object.

In an alternate embodiment, the identified legal pin access locations can be ordered, e.g., based upon some optimization or cost factors. Different visual cues may be employed to distinguish the order of the access locations, e.g., with different coloring or shades to indicate the higher or lower ordering or priority of a given pin access location. This type of ordering may be used, for example, to facilitate automated snapping, with the optimal and/or lowest cost location selected as the snap location.

Figure 6A:
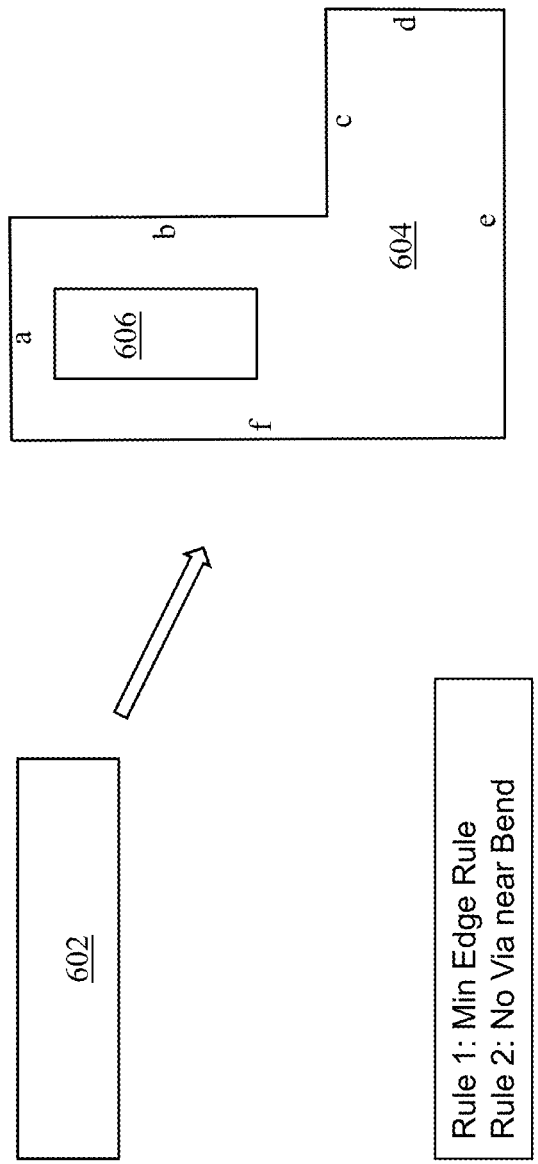
FIGS. 6A-F provide an illustrative example of an embodiment of the invention.

FIGS. 6A-F provide an illustrative example of an embodiment of the invention. FIG. 6A shows a pin object 604 having a preexisting via 606. Pin object 604 is a polygon having six sides, including sides a, b, c, d, e, and f. Assume that it is desired to route wire object 602 to pin object 604. Further assume that any access locations for wire object 602 on pin object 604 must comply with design rules, including (a) a "minimum edge" rule and (b) a "no via near bend" rule. The "minimum edge" rule prohibits any placement locations that would result in an edge that is less than a minimum edge length. The "no via near bend" rule establishes a minimum distance between any vias and a bend in an object.

Figure 6B:
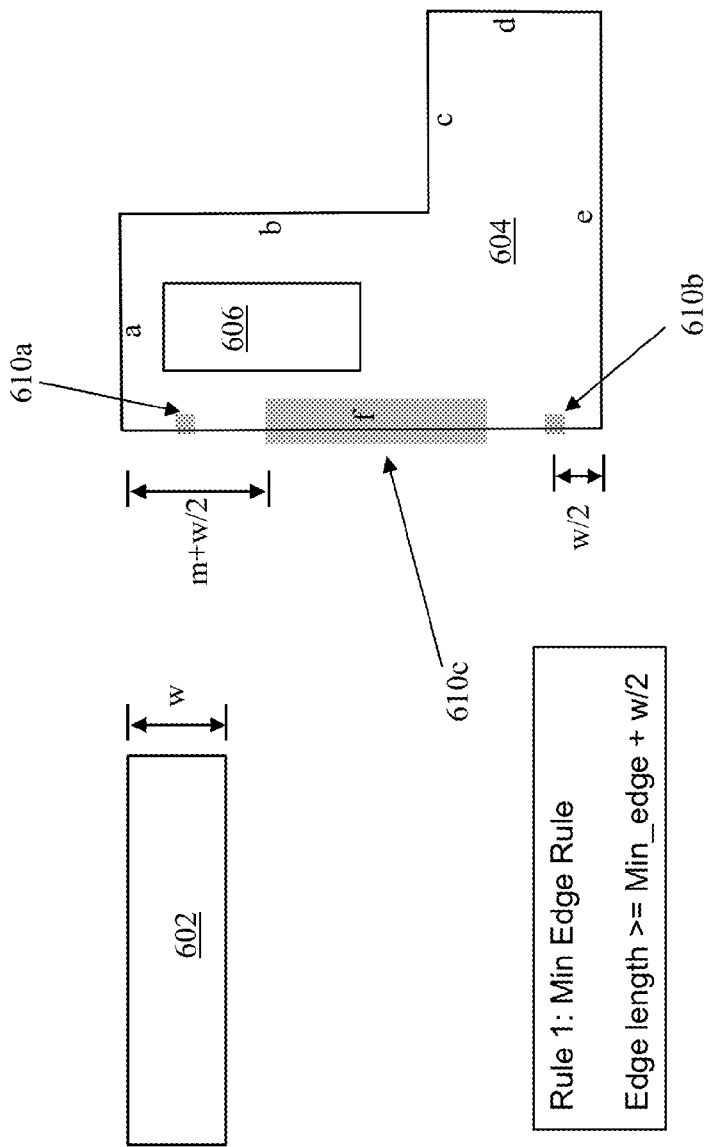

FIG. 6B illustrates how legal pin access locations can be determined relative to the "minimum edge" rule. The "minimum edge" rule specifies that an edge must have a minimum length "min_edge". In other words, any edge in the design must have a length of at least the "min_edge" value to be legal and not in violation of this rule. Assume that the legal pin access locations are determined relative to the centerline of a wire object, e.g, to show the legal placement location of the center of the wire object along a given edge. If the wire object edge has a width "w", the centerline of that edge would be at a distance "w/2". Therefore, the length of an edge must be greater than or equal to "min_edge+w/2".

With respect to edge "f" of the pin shape 604, it can be seen that region 610*c* provides a set of pin access locations where the centerline of wire object 602 can be placed and still have enough length for the edge on either side to meet the minimum edge length requirements. This means that placement of wire object 602 anywhere within region 610*c* will avoid creation of an edge on side "f" having a length that is smaller than the "min_edge" length value.

Location 610*a* is a point location at which wire object 602 can be placed so that the upper portion of wire object 602 is directly aligned with edge "a". This is also a legal placement location since this location will not create any edges on side 'f' above the wire object 602, and the edge created below the wire object 602 on side "f" has an edge length that exceeds the "min_edge" length. Similarly, location 610*b* is a point location at which wire object 602 can be placed so that the lower portion of wire object 602 is directly aligned with edge "e". This is a legal placement location since this will not create any edges on side 'f' below the wire object 602, and the edge created above the wire object 602 on side "f" has an edge length that exceeds the "min_edge" length.

Placement of wire object 602 anywhere except locations 610*a*, 610*b*, or 610*c* on side "f" will result in creation of an edge having a length that is smaller than the "min_edge" length value. Therefore, these other locations are not legal pin access locations.

Figure 6C:
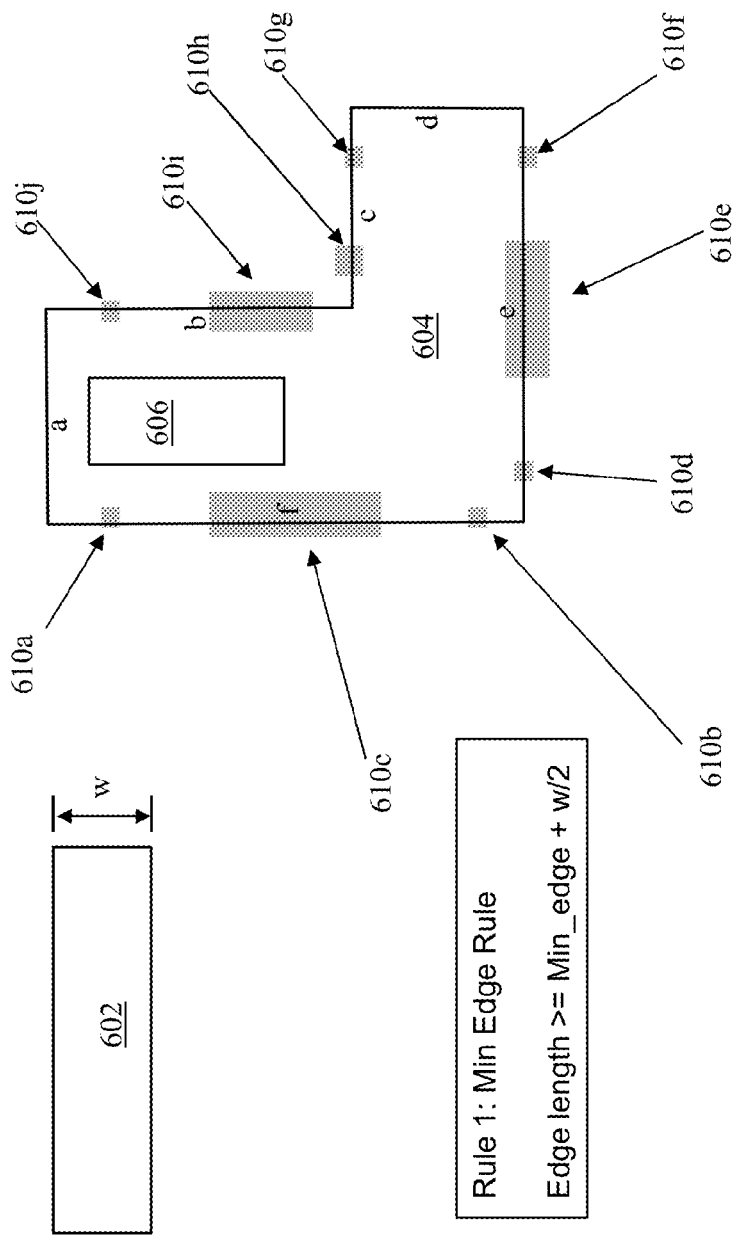

This approach can similarly be used to determine the legal pin access locations relative to the "min edge rule" for the rest of the sides on the pin object 604. FIG. 6C illustrates the legal pin access locations for wire object 602 on all of the sides of the pin object 604 (for wire having a lengthwise orientation relative to the pin). Here, it is assumed that the length of sides "a" and "d" are small enough such that there are no legal locations on these sides that permit placement of wire object 602. Therefore, no pin access locations are identified for sides "a" and "d". However, it is assumed that each of the other sides have identifiable pin access locations that are legal, including locations 610*d*, 610*e*, and 610*f* on side "e", locations 610*g* and 610*h* on side "c", and locations 610*i* and 610*j* on side "b".

Figure 6D:
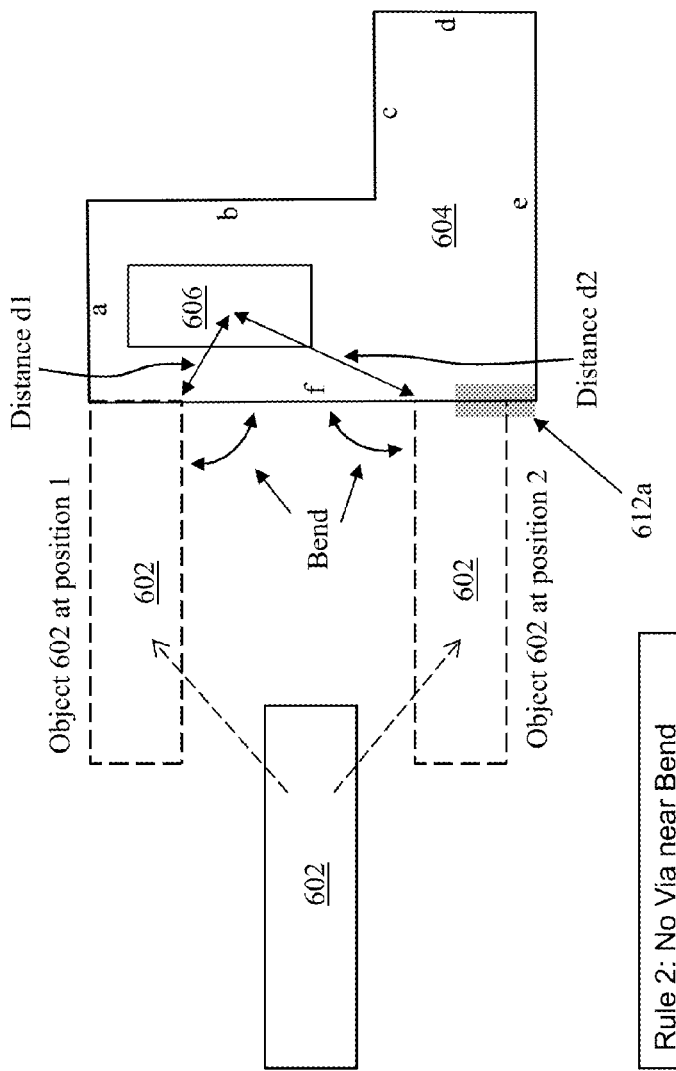

FIG. 6D illustrates how legal pin access locations can be determined relative to the "no via near bend" rule. This rule specifies that a minimum distance must exist between a via and any bend in the design. If a via is located closer than this minimum distance to a bend in the design, then there will be a violation of this rule. As before, it is assumed that the legal pin access locations are determined relative to the centerline of a wire object, e.g, to show the legal placement location of the center of the wire object along a given edge. It is further assumed in the current example that the distance calculation for the via is determined for the center point of the via (although other via points may also be used in the calculations).

For the purpose of illustration, the wire object 602 has been placed into two possible locations relative to the pin object 604 on its side "f" (i.e., location 1 and location 2). Each of these locations results in creation of a bend in the design. Placement of wire object 602 at position 1 results in a distance "d1" between the bend and the via 606. Placement of wire object 602 at position 2 results in a distance "d2" between the bend and the via 606.

Assume that distance d2 is exactly the minimum distance at which the via 606 can be placed to satisfy the "no via near bend" rule. This means that the wire object can be legally placed at this location 2 and any other locations creating a distance greater than distance d2. These legal pin access locations are shown as region 612*a*.

However, any placement locations on side "f" that results in a smaller distance between the via 606 and a bend would be a violation of the design rule. For example, placement of wire object 602 at position 1 would result in a distance d1 between the via 606 and the resulting bend, where distance d1 is less than the minimum distance. Therefore, position 1 is not a legal pin access location for wire object 602 according to the "no via bear bend" rule. In fact, placement of wire object 602 anywhere except at location 612*a* will result in creation of a bend that is closer than the minimum distance to the via 606. Therefore, any locations other than region 612*a* would not be legal pin access locations.

Figure 6E:
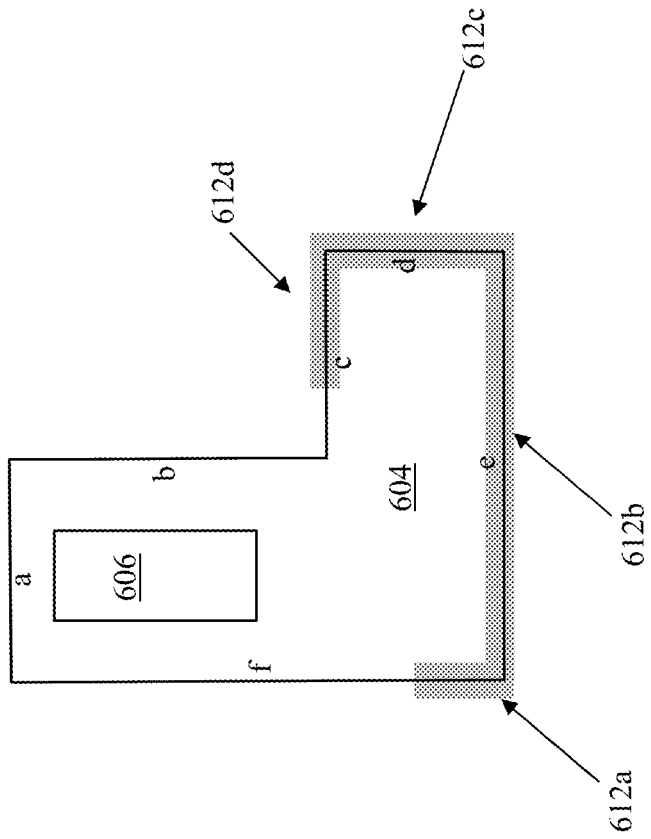

This approach can be used to determine the legal pin access locations relative to the "no via near bend" for the rest of the sides on the pin object 604. FIG. 6E illustrates the legal pin access locations for wire object 602 on all of the sides of the pin object 604. Here, locations 612a, 612b, 612c, and 612d are the legal pin access locations relative to this design rule.

Figure 6F:
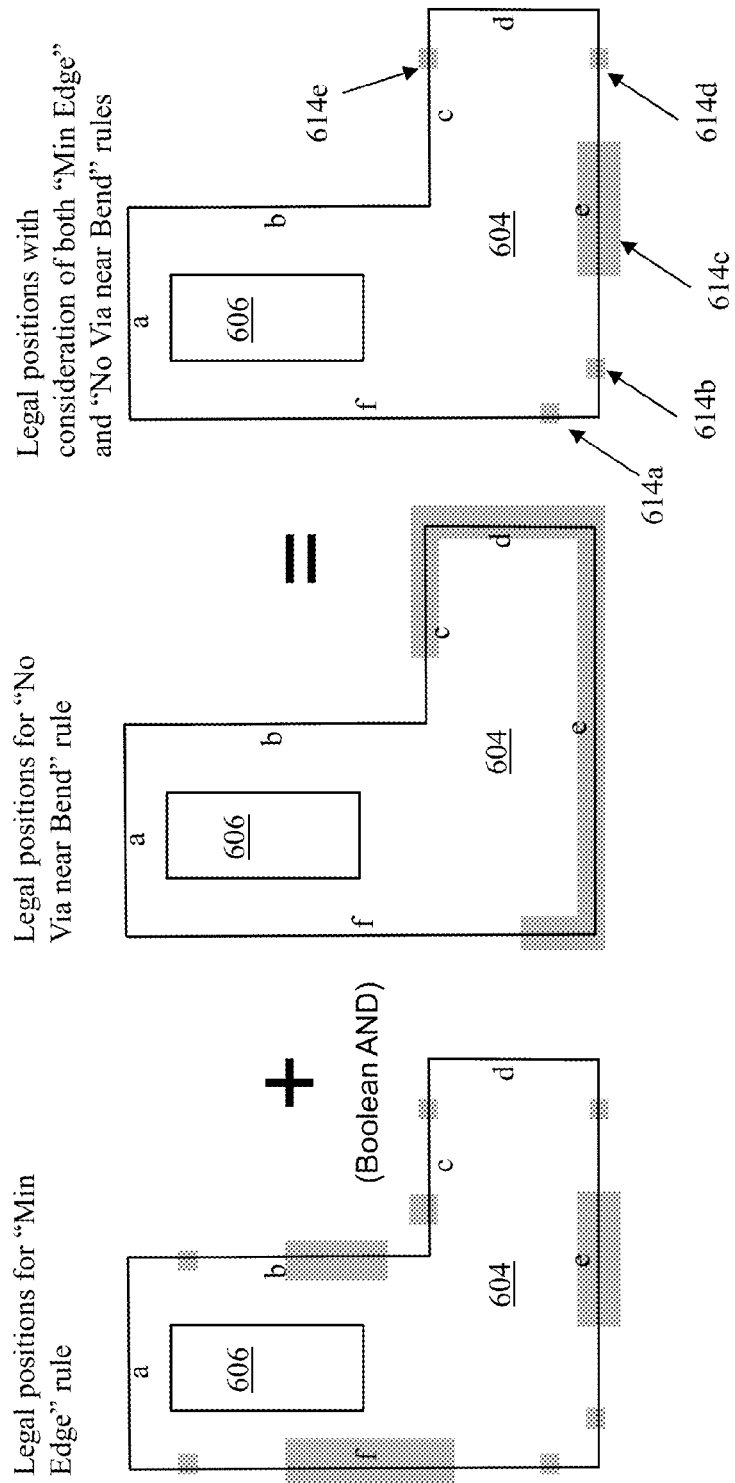

FIG. 6F illustrates how the results of the analysis for each rule can be combined to identify the legal pin access location on pin object 604. In the current embodiment, a Boolean AND operation is performed between the two result sets to combine the two sets of legal pin access locations. This results in a set of locations 614a on side "f", locations 614b, 614c, and 614d on side "e", and location 614e on side "c" that are4 identified as legal pin access locations for pin object 604.

The user interface can now be configured to visually present these locations to the user. FIG. 7 shows a user interface display 700 that provides visual cues to indicate the legal pin access locations to a user. Specifically, crosshair indictors 714a, 714b, 714d, and 714e indicate legal point locations for placement of the wire object, and regional cue 714c is displayed to indicate a region of legal pin access locations for placement of the wire object.

Figure 8A:
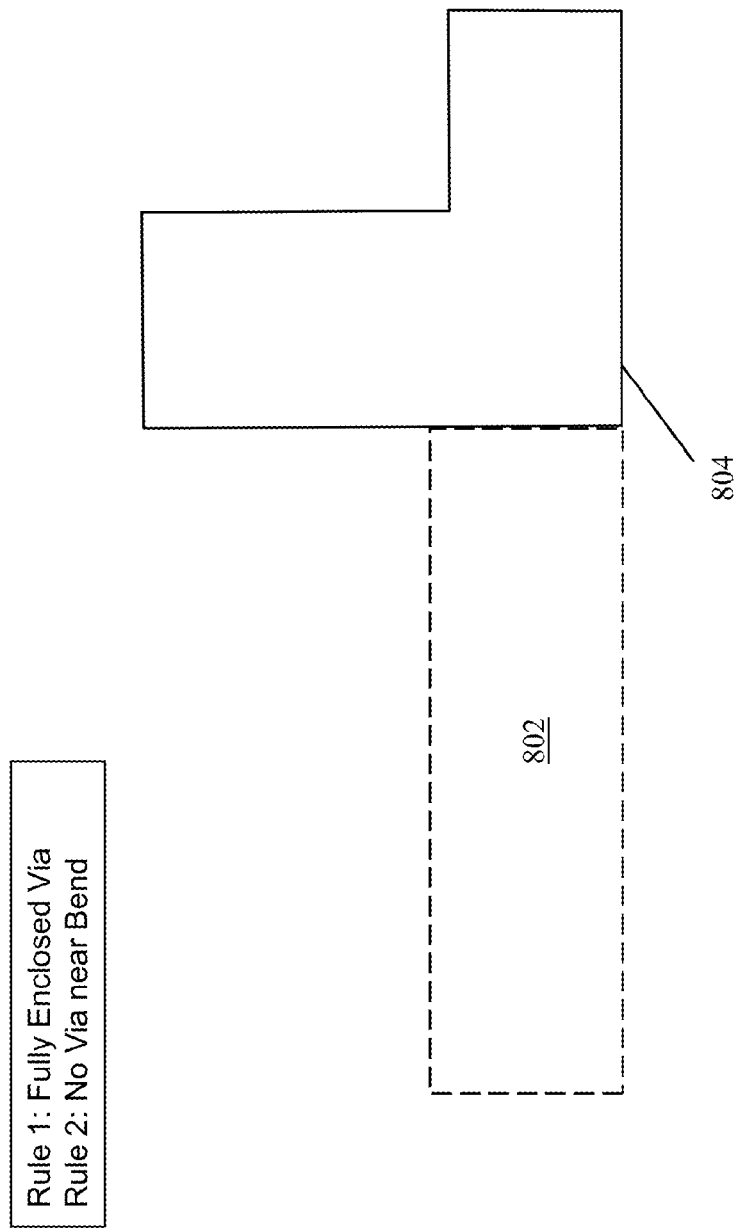
FIGS. 8A-E provide an illustrative example of an embodiment of the invention as applied to via placement.

FIGS. 8A-E provide an illustrative example of an embodiment of the invention as applied to via placement. FIG. 8A shows a pin object 604 that is already connected to a wire object 802. It is assumed that any access locations for a via on pin object 604 must comply with design rules, including (a) a "fully enclosed via" rule and (b) a "no via near bend" rule. The "fully enclosed via" rule prohibits any placement locations that would result in a via that is not fully enclosed within the edges of the pin object 804. As previously noted, the "no via near bend" rule establishes a minimum distance between any vias and a bend in the design.

Figure 8B:
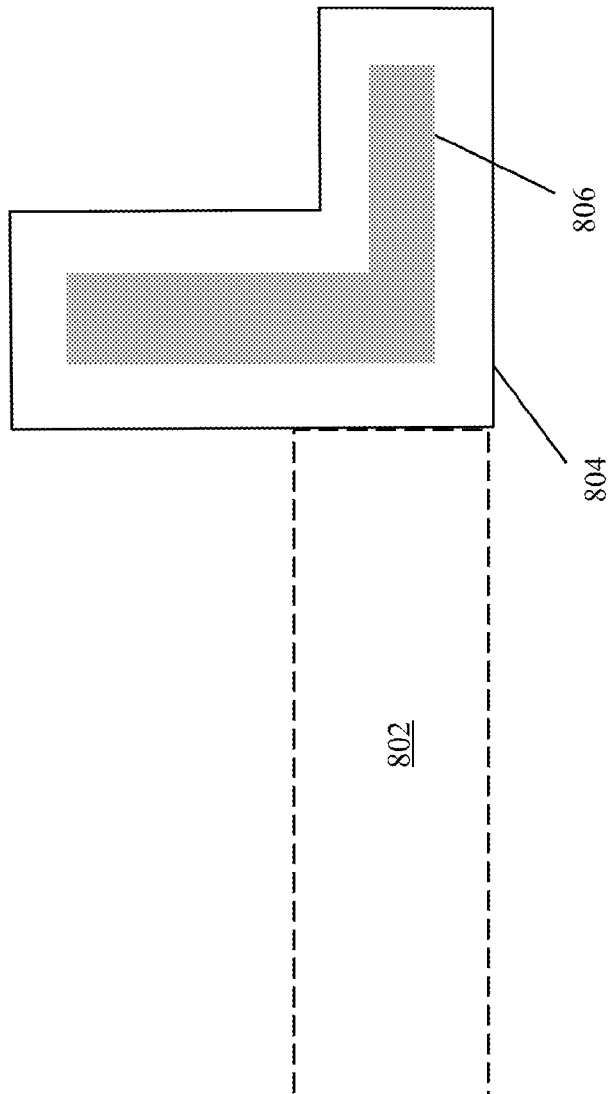

FIG. 8B illustrates how legal pin access locations can be determined relative to the "fully enclosed via" rule. This rule prohibits any placement locations that would result in a via that is not fully enclosed within the edges of the pin object. Region 806 corresponds to the possible locations within pin object 804 at which a via can be placed and not cause a violation of the "fully enclosed via" rule.

Figure 8C:
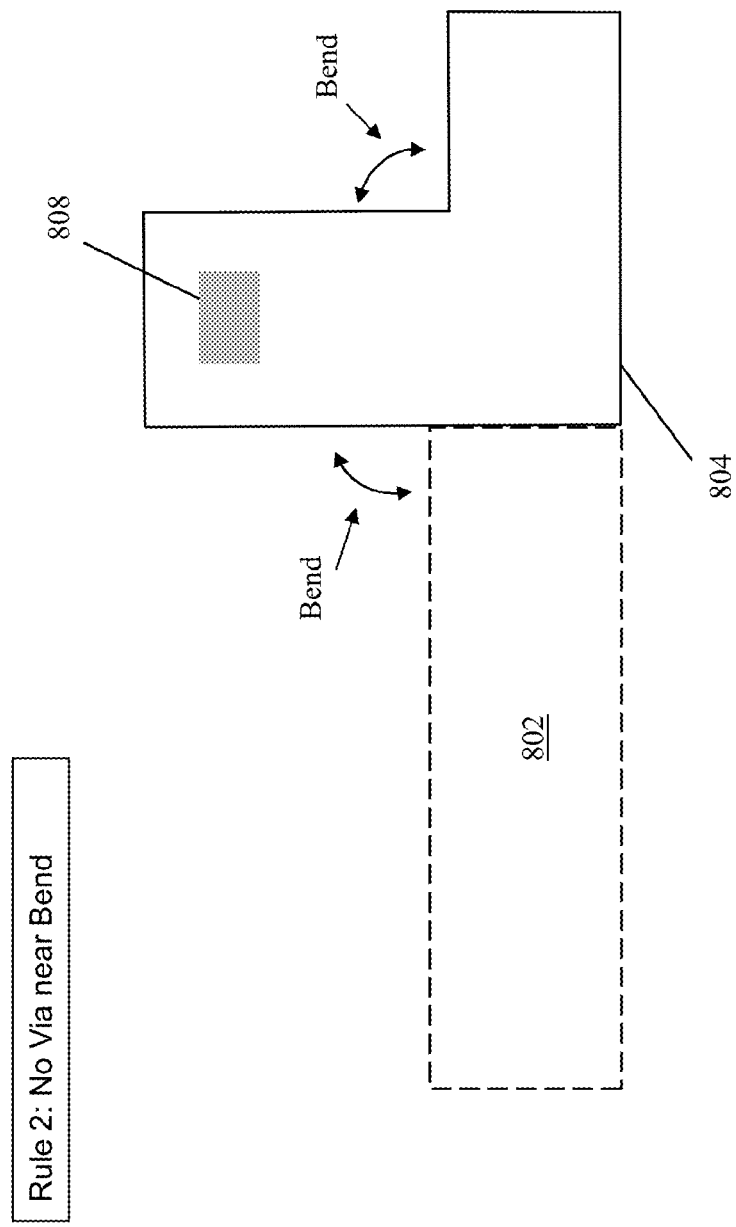

FIG. 8C illustrates how legal pin access locations can be determined relative to the "no via near bend" rule. This rule specifies that a minimum distance must exist between a via and any bend in the design. If a via is located closer than this minimum distance to a bend in the design, then there will be a violation of this rule. It can be seen that there are two bend in the design, one on the left side caused by the placement of wire object 802 to the pin object and another on the right side that is inherent in the shape of the pin object.

Here, it is assumed that only the top portion of the pin object is far enough away from the bends to permit placement of the via. Therefore, this figure shows a region 808 that corresponds to the possible locations within pin object 804 at which a via can be placed and not cause a violation of the "no via near bend" rule.

Figure 8D:
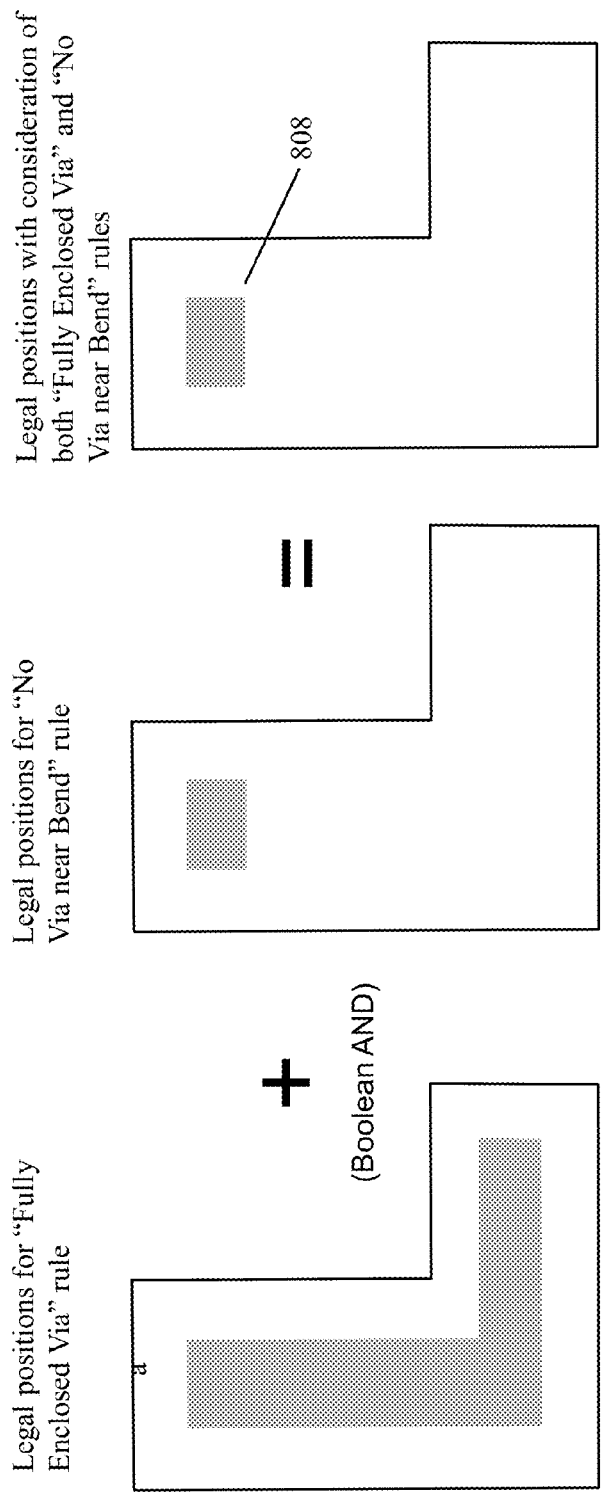

FIG. 8D illustrates how the results of the analysis for each rule can be combined to identify the legal pin access locations on pin object 804 for placement of a via. In the current embodiment, a Boolean AND operation is performed between the two result sets to combine the two sets of legal pin access locations. This results in identification of only region 808 as the legal pin access locations for a via on pin object 804.

Figure 8E:
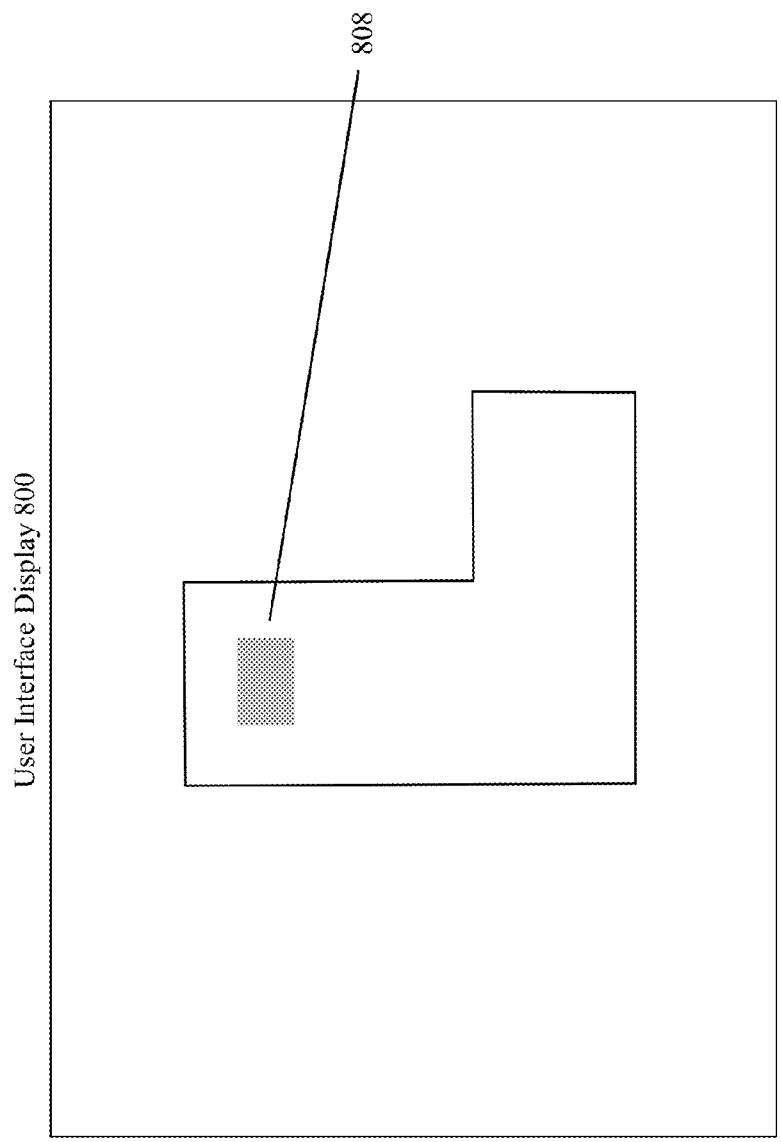

The user interface can now be configured to visually present these locations to the user. FIG. 8E shows a user interface display 800 that provides visual cues to indicate the legal pin access locations to a user. Specifically, regional cue 808 is displayed to indicate a region of legal pin access locations for placement of a via.

Therefore, what has been shown is a method and system for visualizing pin access locations on an integrated circuit design. Visual feedback is provided to a user that is attempting to connect a wire or a via to a pin structure polygon on the integrated circuit design. In some embodiments, the visual feedback comprises any visual cue that provides an indication of a legal location to access the pin. Examples of such visual cues include coloring, highlighting, crosshairs, and the like. The visualized locations on the design are selected such that they correspond to locations that are predicted to avoid a design rule violation. For example, during interactive editing of an electronic design, the user can be visually guided to these access spots.

This approach enables and/or facilitates interactive editing of connectivity objects (e.g., wires and vias) in technologies with complex rules. An example technology is the 22 nm technology, where various design rules severely limit the ways that pins can be accessed.

System Architecture Overview

Figure 9:
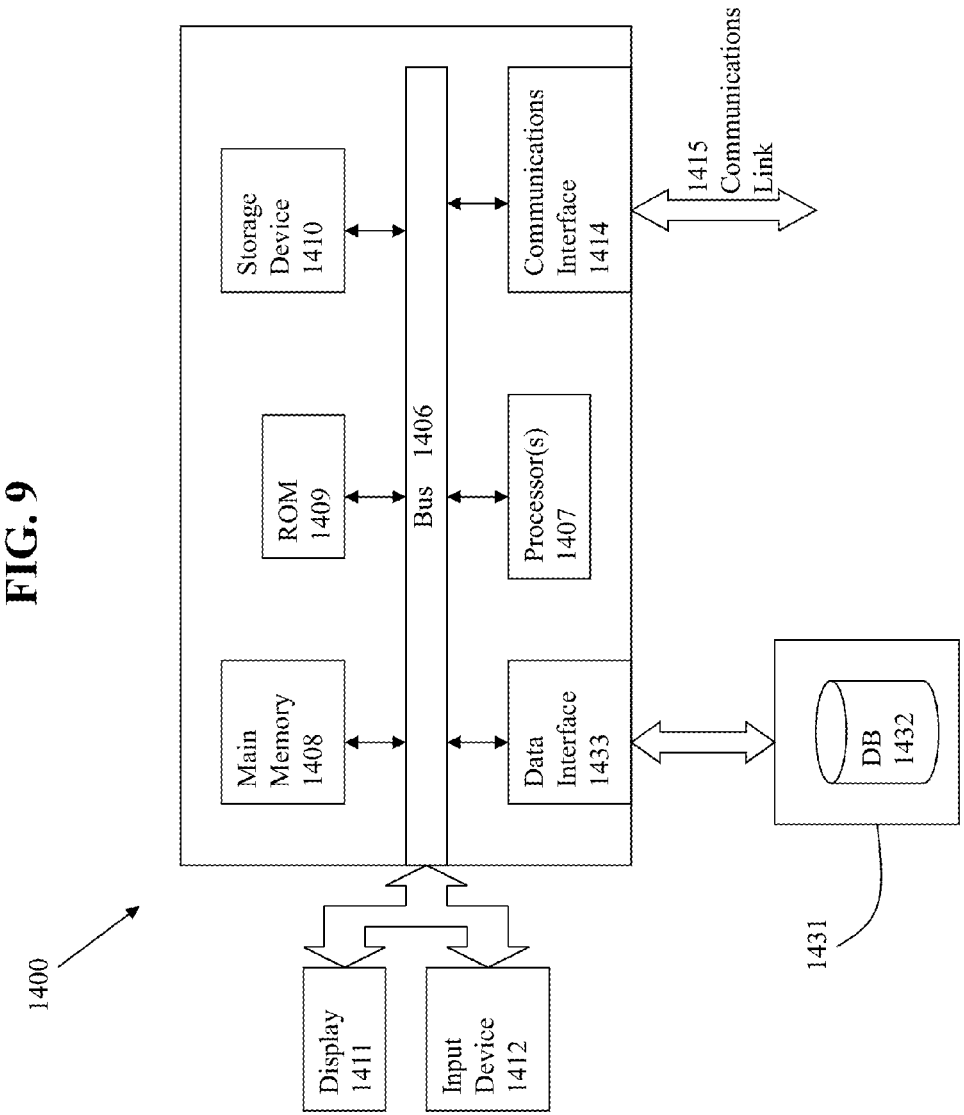
FIG. 9 shows an architecture of an example computing system with which the invention may be implemented.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another. Data may be accessed on a database 1432 on a storage device 1432 through a data interface 1433.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method implemented with a processor, the method comprising:
   using at least a processor to execute a process, the process comprising:
   accessing layout data for an electronic design;
   setting object parameters for access of a routing object to a pin object within the electronic design;
   determining a legal pin access location on the pin object for placement of the routing object by at least preprocessing a polygon of the pin to create multiple access points for the polygon of the pin, wherein
      the multiple access points comprise a subset of a perimeter of the polygon of the pin or a subset of interior of the polygon, and
      the layout data is considered with design rules and the object parameters to determine the legal pin access location; and
   generating visual data pertaining to the legal pin access location to be displayed to a user on a user interface to identify the legal pin access location to the user.

2. The method of claim 1, in which the layout data comprises first information about static shapes corresponding to the pin object, second information about movable shapes corresponding to objects on a same net as the pin object, or third information about via objects above or below the pin object.

3. The method of claim 1, in which the object parameters comprise information regarding wire width, wire direction, wire orientation, via type or via cut size.

4. The method of claim 1, in which visual data comprises a visual cue to distinguish legal locations from non-legal locations for accessing the pin object.

5. The method of claim 1, in which the visual data comprises coloring, highlighting or crosshairs.

6. The method of claim 1, in which the routing object comprises a via or a wire.

7. The method of claim 1, in which the visual data pertaining to the legal pin access location is to be displayed on a user interface for an interactive layout editing tool.

8. The method of claim 1, in which an ordering is provided for multiple legal pin access locations.

9. The method of claim 1, in which snapping is configured to automatically snap the routing object to the legal pin access location.

10. A computer program product embodied on a non-transitory computer usable medium, the non-transitory computer readable medium having stored thereon a sequence of instructions which, when executed by a processor causes the processor to execute a method for visualizing an electronic circuit design, the method comprising:
   accessing layout data for an electronic design;
   setting object parameters for access of a routing object to a pin object within the electronic design;
   determining a legal pin access location on the pin object for placement of the routing object by at least preprocessing a polygon of the pin to create multiple access points for the polygon of the pin, wherein
      the multiple access points comprise a subset of a perimeter of the polygon of the pin or a subset of interior of the polygon, and
      the layout data is considered with design rules and the object parameters to determine the legal pin access location; and
   generating visual data pertaining to the legal pin access location to be displayed to a user on a user interface to identify the legal pin access location to the user.

11. The computer program product of claim 10, in which the layout data comprises first information about static shapes corresponding to the pin object, second information about movable shapes corresponding to objects on a same net as the pin object, or third information about via objects above or below the pin object.

12. The computer program product of claim 10, in which the object parameters comprise information regarding wire width, wire direction, wire orientation, via type or via cut size.

13. The computer program product of claim 10, in which visual data comprises a visual cue to distinguish legal locations from non-legal locations for accessing the pin object.

14. The computer program product of claim 10, in which the visual data comprises coloring, highlighting or crosshairs.

15. The computer program product of claim 10, in which the routing object comprises a via or a wire.

16. The computer program product of claim 10, in which the visual data pertaining to the legal pin access location is to be displayed on a user interface for an interactive layout editing tool.

17. The computer program product of claim 10, in which an ordering is provided for multiple legal pin access locations.

18. The computer program product of claim 10, in which snapping is configured to automatically snap the routing object to the legal pin access location.

19. A system for visualizing an electronic circuit design, comprising:
   a processor;
   a memory for holding programmable code, wherein
      the programmable code includes instructions which, when executed by the processor, cause the processor to:
      access layout data for an electronic design;
      set object parameters for access of a routing object to a pin object within the electronic design;
      determine a legal pin access location on the pin object for placement of the routing object by at least preprocessing a polygon of the pin to create multiple access points for the polygon of the pin, wherein
         the multiple access points comprise a subset of a perimeter of the polygon of the pin or a subset of interior of the polygon, and
         the layout data is considered with design rules and the object parameters to determine the legal pin access location; and generate visual data pertaining to the legal pin access location to be displayed to a user on a user interface to identify the legal pin access location to the user.

20. The system of claim 19, in which the layout data comprises first information about static shapes corresponding to the pin object, second information about movable shapes corresponding to objects on a same net as the pin object, or third information about via objects above or below the pin object.

21. The system of claim 19, in which the object parameters comprise information regarding wire width, wire direction, wire orientation, via type or via cut size.

22. The system of claim 19, in which visual data comprises a visual cue to distinguish legal locations from non-legal locations for accessing the pin object.

23. The system of claim 19, in which the visual data comprises coloring, highlighting or crosshairs.

24. The system of claim 19, in which the routing object comprises a via or a wire.

25. The system of claim 19, in which the visual data pertaining to the legal pin access location is to be displayed on a user interface for an interactive layout editing tool.

26. The system of claim 19, in which an ordering is provided for multiple legal pin access locations.

27. The system of claim 19, in which snapping is configured to automatically snap the routing object to the legal pin access location.

* * * * *